(12) United States Patent
Chang et al.

(10) Patent No.: US 6,350,994 B1
(45) Date of Patent: Feb. 26, 2002

(54) STRUCTURE OF CRITICAL DIMENSION BAR

(75) Inventors: Kun-Yuan Chang, Changhua Hsien; Chia-Ming Cheng, Chiayi Hsien, both of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/715,356

(22) Filed: Nov. 17, 2000

(30) Foreign Application Priority Data

Nov. 14, 2000 (TW) ........................................ 89124068 A

(51) Int. Cl.[7] .............................................. H01L 23/58
(52) U.S. Cl. ....................................................... 257/48
(58) Field of Search ............................... 257/48; 438/14, 438/16; 250/492.22; 430/11, 22, 30; 355/77; 356/399, 401

(56) References Cited

U.S. PATENT DOCUMENTS 6,094,256 A * 7/2000 Grodnensky et al. ......... 355/77

* cited by examiner

*Primary Examiner*—Keith Christianson
(74) *Attorney, Agent, or Firm*—Thomas, Kayden, Horstemeyer & Risley

(57) ABSTRACT

A structure of a critical dimension bar. The critical dimension bar is formed on a substrate between the dies. A base layer is formed on a portion of the substrate, and a critical material layer is formed on the die, the base layer and the substrate with a uniform thickness. The base layer has a thickness to result in a surface profile the same as the die. A die photomask pattern, a first and a second test photomask patterns on a photomask are then transferred to the critical material on dies, the base layer and the substrate, respectively. These three photomask patterns have the same pattern width.

12 Claims, 9 Drawing Sheets

STRUCTURE OF CRITICAL DIMENSION BAR

CROSS-REFERENCE TO RELATED APPLICATION

This application claims the priority benefit of Taiwan application serial no. 89124068, filed Nov. 14, 2000.

BACKGROUND OF THE INVENTION

1. Field of the Invention

The invention relates in general to the structure of monitoring tool for photolithography and etching process. More particularly, this invention relates to the structure of a critical dimension bar (CD bar).

2. Description of the Related Art

In each stage of semiconductor fabrication process, the photolithography and etching process is one of the most crucial steps that determine the product performance. The objective and for photolithography process is to transfer the pattern of a photoresist layer to a material layer. The process comprises forming and patterning the photoresist layer on the material and performing an etching process on the material layer using the patterned photoresist layer as a mask. As a result, the material layer is patterned. When a width of the pattern of the material becomes an important parameter of the electronic device (or when the width of such pattern is the narrowest among all the patterned layers on the wafer), the width is called critical dimension. The material layer having the pattern with such width is also referred as a critical material layer. Since the critical dimension plays an important role for the product characteristics, the error of the critical dimension has to be controlled within a certain range to avoid the deterioration of devices.

Referring to FIG. 1, in a conventional photolithography and etching process, to monitor the error of critical dimension for patterned critical material layer, critical dimension bars 120 with simple pattern of the critical material layer are formed on the scribe lines. The scribe lines are the dot-point lines between the dies 110 on the wafer. This is because the pattern of the integrated circuits on the surfaces of the dies 110 are normally very complex, it is thus very difficult to directly measure the critical dimension of the critical material layer. Therefore, one has to measure the critical dimension bars 120 to determine the critical dimension of the critical material layer on the dies 110.

FIG. 2A shows a schematic drawing of a cross section view of a conventional critical dimension bar. The fabrication process is briefly described as follows. In the photolithography and etching processes for various layers before forming the critical material layer, the applied photomasks do not comprise the pattern of the critical dimension bar 120. Therefore, the surface of the substrate 200 for forming such critical dimension bar 120 is flat. A critical material layer 210 is formed on substrate 210 on which the critical dimension bar is to be formed while such critical material layer 210 is formed on the dies. A photolithography and etching process is performed to form a patterned photoresist layer (not shown) on the critical material layer 210. A photomask with an opening pattern similar to that over the die is used to expose the photoresist layer as an example. The pattern width of both photomasks to expose the critical material layer over the die and the critical material layer 210 for patterning the critical dimension bar 120 is the same, however, the pattern for forming the critical dimension bar is simpler.

After exposure, development, baking and other subsequent processes are performed to form the openings 220a in the critical material layer 210. As the critical dimension bar 120 is formed with a pattern width as that of the critical material over the die, the critical dimension of the openings 220a formed on the die 110 as shown in FIG. 2B can be obtained.

Referring to FIG. 3, in a conventional fabrication process, several patterning processes have been performed in the die area 110 on the substrate 300 prior to formation of the critical material layer 210. Therefore, an uneven surface is resulted as shown. When a photoresist layer is coated and exposed on the critical material layer 210, a focus offset between the elevated portion (the P area) and the lower portion (the Q area) is resulted. That is, the distances between the focal point of the exposure light source and the bottom surface of the photoresist layer 215 at the P area and the Q area are different from each other. Consequently, referring to FIG. 3B, the opening 220b formed on the P area has a width $d_1$ different from the width $d_2$ of the opening 220c formed on the Q area. That is, the critical dimensions of the openings 220b and 220c are different from each other.

As mentioned above, since the critical dimension bar 120 is formed on a substrate surface directly. Without the uneven surface as the die region on the substrate, the exact critical dimension can hardly be precisely simulated via the critical dimension bar.

In addition, referring to FIG. 2B, several openings 220a are distant away from each other. In the conventional critical dimension bar, only the openings 220b/c close to each other can be formed. It is inevitably to cause deviation of the critical dimensions of these openings since the exposure light beams traveling through the neighboring opening patterns of the photomask may interfere with each other.

SUMMARY OF THE INVENTION

The invention provides a structure of a critical dimension bar to solve the problems occurring while using the conventional critical dimension bar. The critical dimension bar comprises an uneven surface and non-uniformly distributed patterns similar to those of the die, so that the critical dimension of the die can be precisely determined. The structure is formed on a substrate between neighboring dies. The structure comprises a base layer and a patterned critical material layer. The base layer is formed on the substrate to result in a same surface profile as the die. The critical material layer on the die, the base layer and the substrate surface comprises the die pattern, a first test pattern and a second test pattern transferred from the die photomask pattern, the first test photomask pattern and the second test photomask pattern, respectively. These patterns comprise similar type of patterns and the same width.

The invention further provides a method for fabricating the critical dimension bar. A base layer is formed on a portion of the substrate, such that the portion of the substrate has the same surface profile as the die. A critical material layer is formed on the die and the portion of the substrate. Using a photomask comprising a die photomask pattern, a first test photomask pattern and a second test photomask pattern to perform an exposure step, a die pattern, a first test pattern and a second test pattern are formed in the die and the portion of the substrate. The die photomask pattern, the first test photomask pattern and the second test photomask pattern all comprise a same type of pattern with same width.

In addition, in the above structure and method provided by the invention, when the die pattern comprises a first region and a second region with different density of patterns distribution, the first and second test pattern also comprises similar structures as these two regions. As a result, the pattern distribution on the die can be precisely simulated to monitor the influence of the variation in critical dimensions.

The above critical material layer comprises an insulation layer, and the die pattern comprises a contact window pattern or a via hole patter. The critical layer may also comprises a conductive layer such as a polysilicon layer or other conductive material, and the die pattern may comprises a gate line pattern or a conductive line pattern.

The invention further provides a method to monitor the critical dimension deviation. A critical dimension bar with a first test pattern and a second test pattern is provided. The first test pattern and the second test pattern are compared to each other to obtain a deviation of critical dimension of the die pattern. If the die pattern comprises a first region and a second region with two different density of pattern distribution, the first test pattern and the second test pattern corresponds to the patterns of the first and second regions, respectively. The deviation in critical dimension for the first and the second regions of the die pattern can thus be inferred.

As mentioned above, the structure and method for forming the critical dimension bar provided by the invention comprises at least the following the advantages. The design of the critical dimension bar comprises the same surface profile as the die, that is, the same surface height difference as the die, so that the actual pattern of the die can be precisely simulated. The deviation of critical dimension caused by the surface height difference can thus be monitored. In addition, the base layer comprises a first and a second test pattern to correspond to the die pattern with different density of distribution. The variation in critical dimension can thus be precisely reflected.

Both the foregoing general description and the following detailed description are exemplary and explanatory only and are not restrictive of the invention, as claimed.

DESCRIPTION OF THE PREFERRED EMBODIMENTS

First Embodiment

Figure 1:
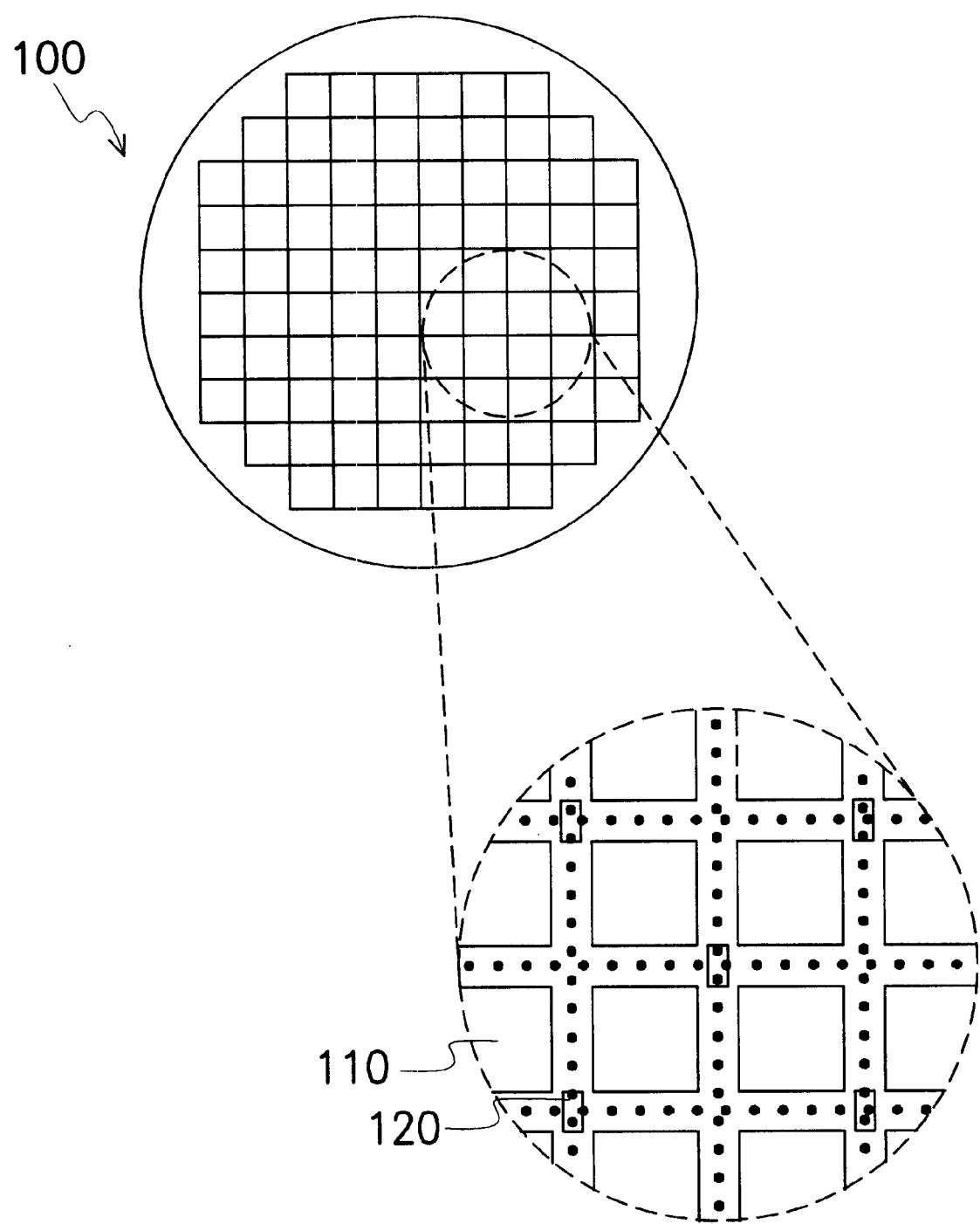
FIG. 1 shows a conventional layout of the critical dimension bar and the die.
Figure 2A:
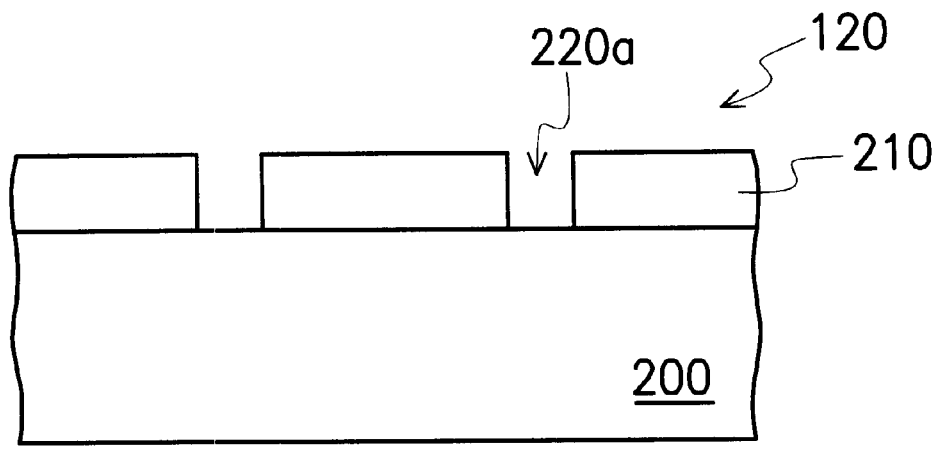
FIGS. 2A and 2B show a cross sectional view and a top view of a conventional structure of a critical dimension bar, respectively.
Figure 2B:
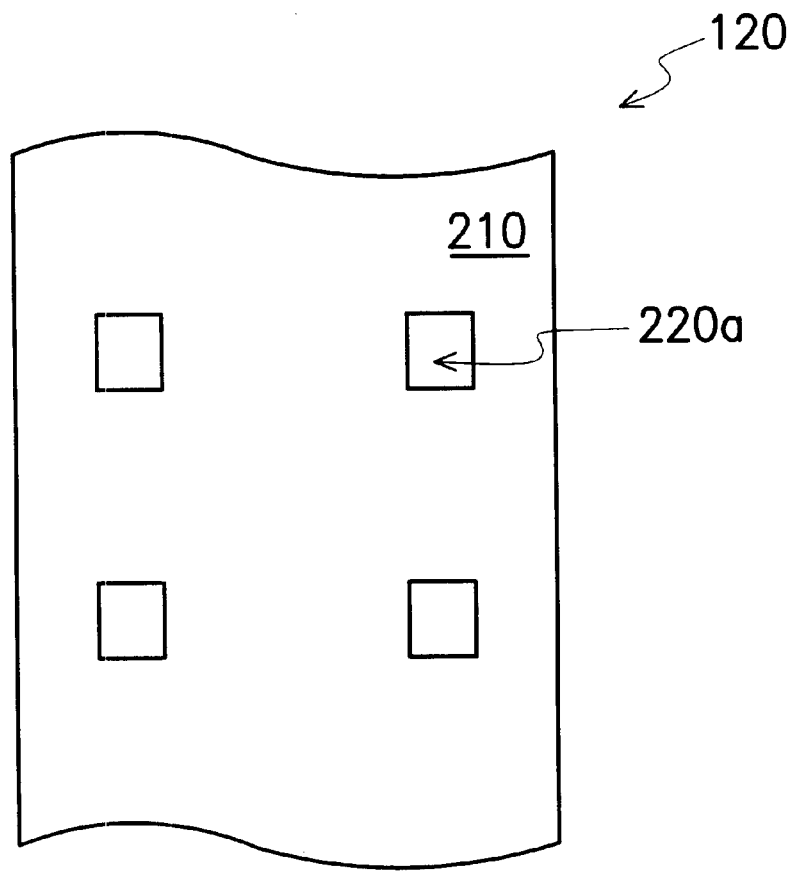
Figure 3A:
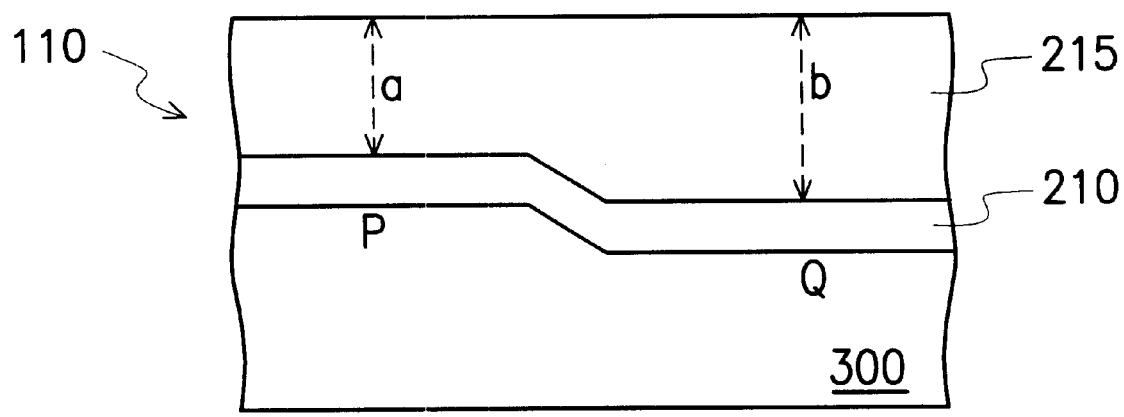
FIGS. 3A–3B are schematic diagram showing the uneven surface after forming the critical material layer and performing photolithography and etching process.
Figure 3B:
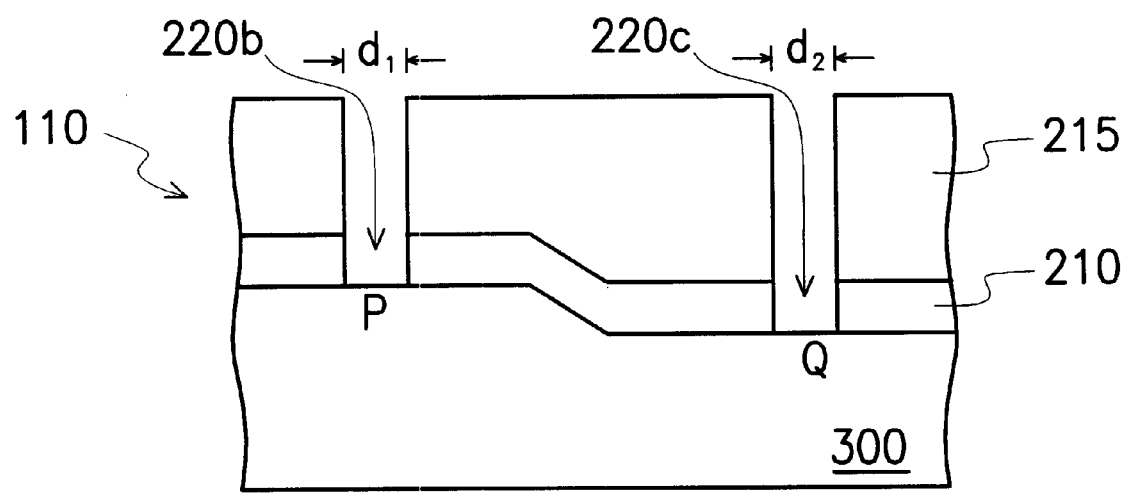
Figure 4A:
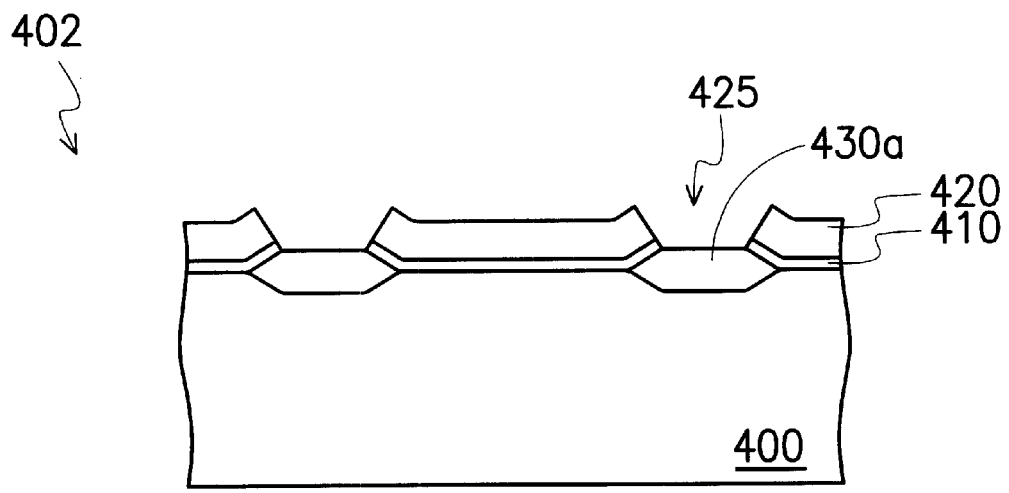
FIGS. 4A–4C are cross sectional views showing formation of a field oxide layer, a polygate line, an insulation layer and contact windows formed a die according to a first embodiment of the invention.
Figure 5A:
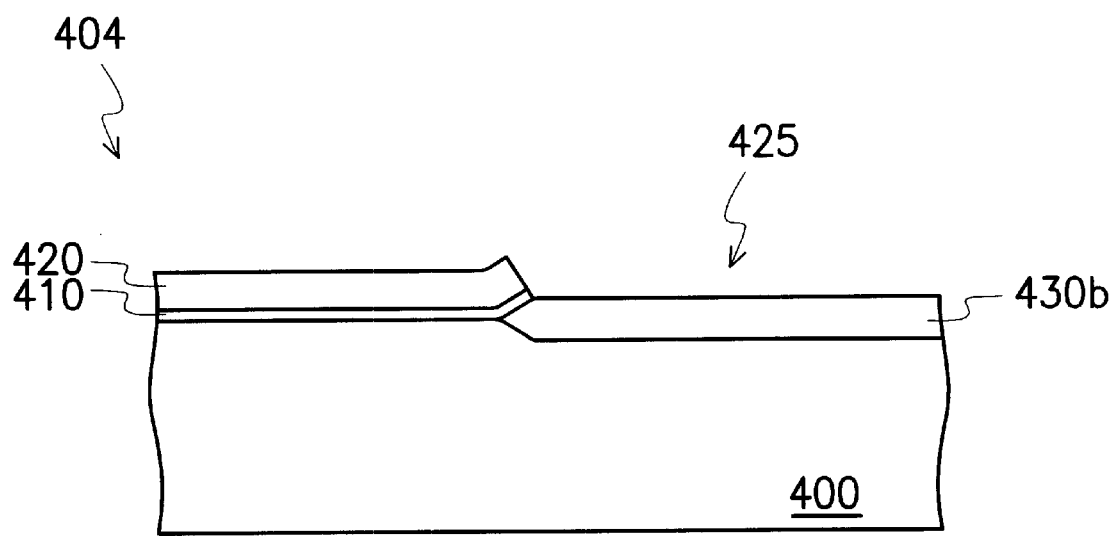
FIGS. 5A–5C are cross sectional views showing the fabrication process for forming the critical dimension bar in the first embodiment.
Figure 4B:
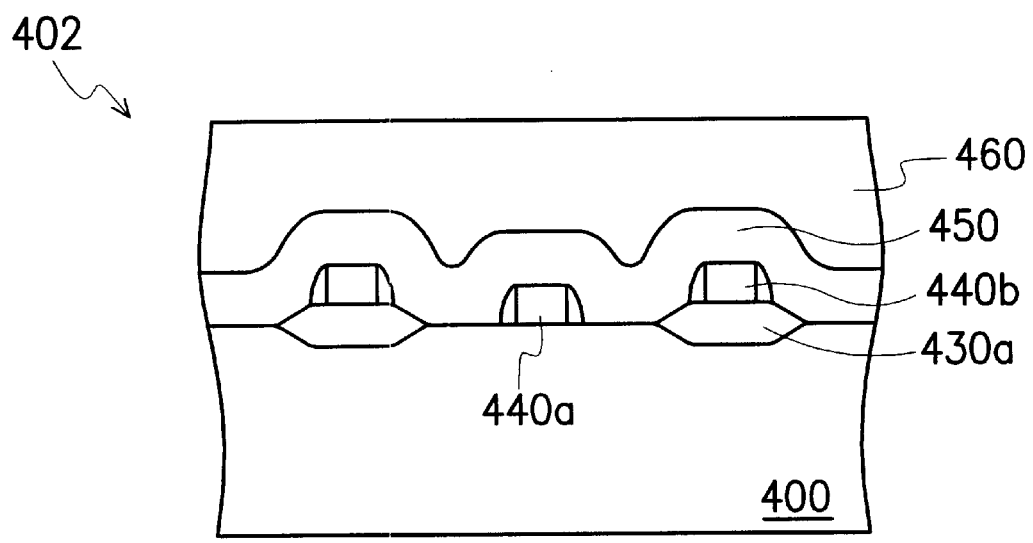
Figure 5B:
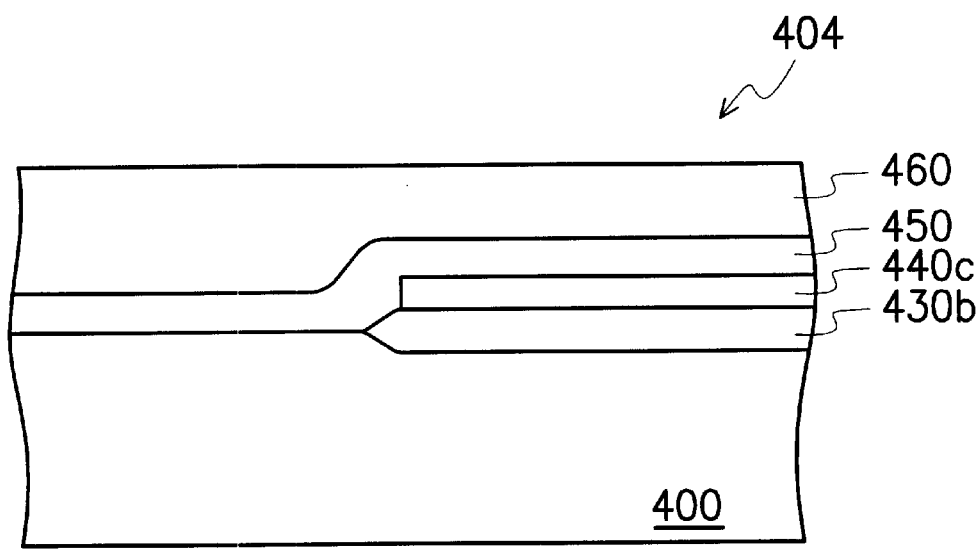
Figure 4C:
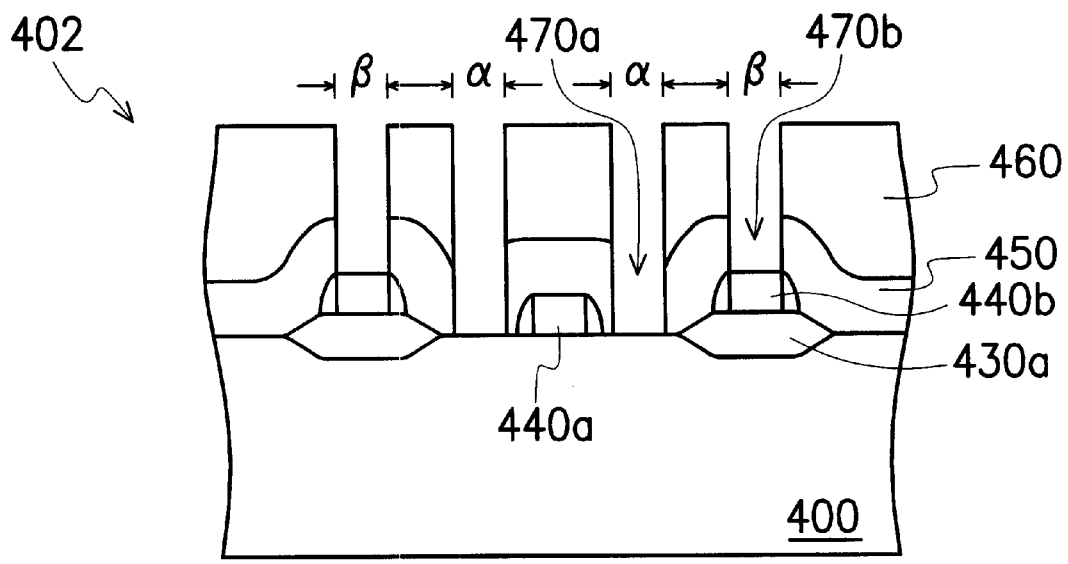
Figure 5C:
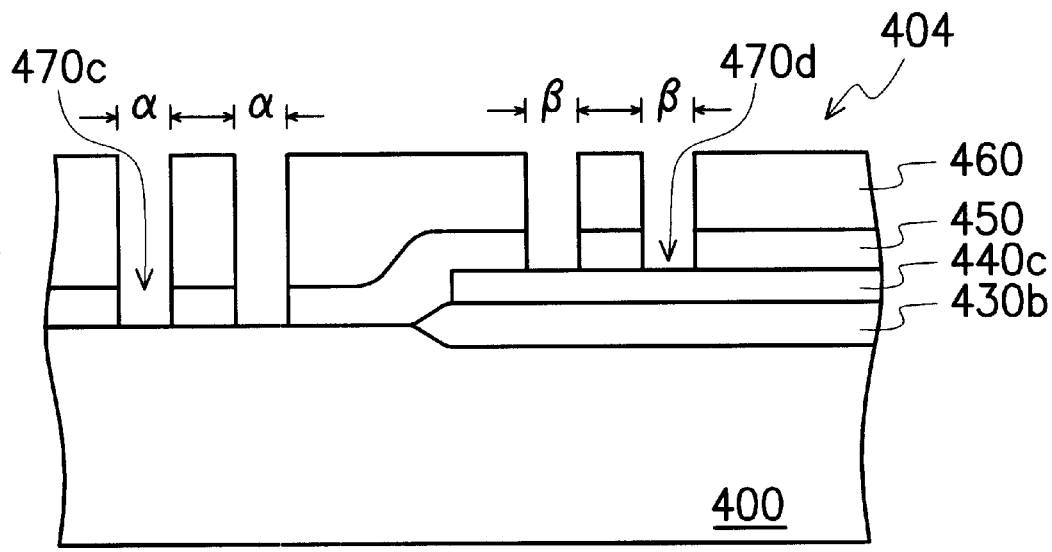

In the first embodiment, the structure and the fabrication process of a critical dimension bar for monitoring the critical dimension of contact window are illustrated as shown in FIGS. 5A–5C. The structure and the fabrication process of various layers on the die are illustrated in FIGS. 4A–4C.

Referring to FIGS. 4A and 5A, a pad oxide layer 410 are formed on on the substrate 400 in both the die area 402 and the critical dimension bar area 404. A mask layer 420, for example, a silicon nitride layer, is formed on the pad oxide layer 410 in the die area 402 and the critical dimension bar area 404. Openings 425 are formed in the mask layer 420 to expose a portion of the pad oxide layer 410. The exposed pad oxide layer 410 is removed to expose portions of the substrate 400 in both the die area 402 and the critical dimension bar area 404. A step of thermal oxidation is performed to form field oxide layers (FOX) 430a and 430b in the die area 402 and the critical dimension area 404, respectively. Since the field oxide layers 430a and 430b are formed at the same step of thermal oxidation, the thickness is about the same.

Referring to FIGS. 4B and 5B, a conformal polysilicon layer is formed along a surface profile of the substrate 400 in both the die area 402 and the critical dimension area 404. The polysilicon layer is patterned to form the polygate lines 440a and 440b on the substrate 404 and on the field oxide layer 430a in the die area 402, and the polysilicon layer 440c on the field oxide layer 430b in the critical dimension bar area 404. Again, as the polygate lines 440a, 440b and the polysilicon layer 440c are formed from the same polysilicon layer, the thickness is about the same. A conformal insulation layer 450 is then formed over the substrate 400 in both the die area 402 and the critical dimension bar area 404. A photoresist layer 460 is then coated on the insulation layer 450.

Referring to FIGS. 4C and 5C, the photoresist layer 460 is patterned to form several openings in both the die area 402 and the critical dimension bar area. The photomask used to pattern the photoresist layer 460 comprises a die photomask pattern, a first test photomask pattern and a second test photomask pattern. These three patterns are to be transferred to the die area 402, the elevated area (the polysilicon layer 440c) and the lower area (the substrate 400) in the critical dimension bar area 404, respectively. The widths of these three photomask patterns, each of which includes a pattern of a contact window (opening) in this embodiment, are the same with each other.

Using the patterned photoresist layer 460 as a mask, the insulation layer 450 is etched to form:

(1) openings 470a exposing the substrate surface 400 between the polygate lines 440a and 440b with a width α in the die area 402;

(2) openings 470b on the polygate lines 440a with a width β in the die area 402;

(3) openings 470c on the substrate surface 400 with a width α in the critical dimension bar area 404; and (4) openings 470d on the polysilicon layer 440c with a width β in the critical dimension bar area 404.

In FIGS. 4B and 5B, the thickness of both the field oxide layers 430a and 430b is about the same, and the thickness for the polygate lines 440a, 440b and the polysilicon layer 440c is the same too. The insulation layer 450 also has a uniform thickness everywhere. The top surface of the insulation layer 450 on the substrate 400 in the critical dimension bar area 404 is thus level with the top surface of the insulation layer 450 on the substrate 400 in the die area 402. Similarly, the insulation layer 450 on the polysilicon layer 440c is also level with the insulation layer 450 on the polygate lines 440b. Therefore, after the photolithography and etching step, the openings 470c in the critical dimension bar area 404 has a same width α as the openings 470a in the die area 402. Similarly, the openings 470d in the critical dimension bar area 404 also have a same width β as the openings 470b in the die area. 402.

Since the openings 470a, 407b have the same critical dimension as the openings 407c, 407d, respectively, the critical dimensions of the openings 470a, 470b in the die area 402 can be obtained from measuring that of the openings 470c, 470d in the critical dimension bar area 404. When the value of α and β are close to each other, it indicates that the focal point of the exposure light source, that is, the position where the focus deviation is zero, is located between the top surface of the insulation layer 450 in the elevated area (the polygate line 440b) and that in the lower area (the surface of the substrate 400) in the die area 402. That is, it is located between the top surface of the insulation layer 450 in the elevated area (the polysilicon layer 440c) and that in the lower area (the surface of the substrate 400) in the critical dimension bar area 404. In contrast, when the critical dimensions α and β are far different from each other, the focal point of the exposure light source is located under the top surface of the insulation layer 450 in the lower area in the critical dimension bar area 404. That is, it is located at the position where the focus deviation is smaller than 0 as shown as the positions where α' and β' located in FIG. 6. Alternatively, it is located over the top surface of the insulation layer 450 in the elevated area, that is, the positions where the focus deviation is larger than 0. Under such circumstances, the position of the wafer has to be adjusted to change the focal point of the exposure light source, so that the difference in critical dimension of the openings 470a, 470b in the die area 402 can be adjusted to a minimum value.

Figure 7:
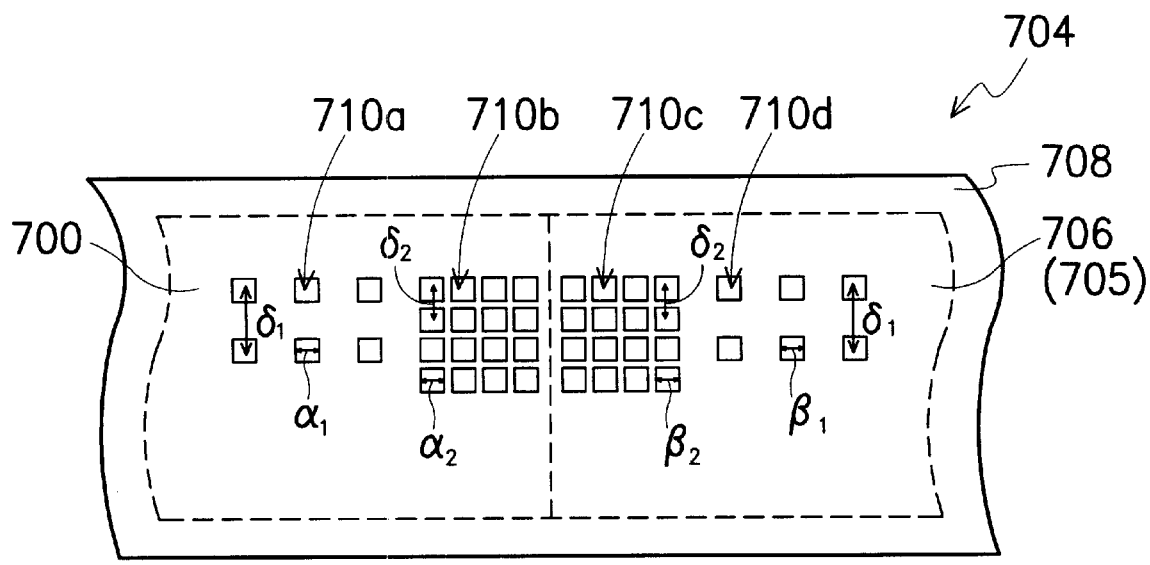
FIG. 7 shows a situation when the critical dimension bar comprises opening patters with dense and dispersive distribution.

In FIG. 7, another structure of critical dimension bar other than the simple structure of the distributed openings is illustrated. The formation process of such structure is similar to that as shown in FIGS. 5A–5C. However, under polysilicon layer 706 in the elevated area, a thermal oxide layer 705 is formed. The openings formed in both the elevated area and the lower area are further distinguished into high density and low density areas. The duty ratio of the openings in both areas is the same as the duty ratio of the openings in the insulation layer in the die area. In addition, while patterning the insulation layer 708, the photomask comprises the die photomask pattern, the first test photomask pattern and the second test photomask pattern corresponding to the die, the elevated area (the polysilicon layer 706) and the lower area (the substrate 700) in critical dimension bar. These three photomask patterns all include opening type patterns with equal width and can be distinguished into dense and diffusive area.

Further referring to FIG. 7, the pattern of the critical dimension bar 704 can be separated into four areas, and the lower area (the substrate surface area 700) further includes:

1. The dispersively distributed openings 710a have a critical dimension $\alpha_1$ and a pitch $\delta_1$, and the duty ratio of these openings is $\alpha_1:\delta_1$, for example, 1:3.0 to simulate the isolated openings in the lower area of the die; and
2. The densely distributed openings 710b have a critical dimension $\alpha_2$ and a pitch $\delta_2$, and the duty ratio of these openings is $\alpha_2:\delta_2$, for example, 1:1.5 to simulate the closely distributed openings in the lower area of the die. The elevated area (the polysilicon layer 706) comprises:
3. The densely distributed openings 710c have a critical dimension $\beta_2$ and a pitch $\delta_2$, and the duty ratio of these openings is $\beta_2:\delta_2$, for example, 1:1.5 to simulate the closely distributed openings in the elevated area of the die; and
4. The dispersively distributed openings 710d have a critical dimension $\beta_1$ and a pitch $\delta_1$, and the duty ratio of these openings is $\beta_1:\delta_1$, for example, 1:3.0 to simulate the isolated openings in the lower area of the die.

Thus, the critical dimensions of the densely and dispersively distributed openings in the elevated and lower areas in the die can be inferred from the critical dimensions $\alpha_1$, $\alpha_2$, $\beta_1$, $\beta_2$. Therefore, whether the focal point of the exposure light should be adjusted can be determined according to the critical dimensions.

As described above, due to the formation of the thermal oxide layer 430b(750) formed on a portion of the substrate 400(700), the polysilicon layer 440c(704), and the conformal insulation layer 450(708), the critical dimension bar 404(704) thus has an uneven surface. The difference in surface levels is the same as that in the die. The openings 470a and 470b formed in insulation layer 450 in the die can thus be inferred according to the variation of the openings 470c(710a/b) and 470d(710c/d) formed in the insulation layer 450(708) in the critical dimension bar 404. When the openings formed in insulation layer 450 in the die are distributed non-uniformly, the critical dimensions of the openings can also be simulated via the critical dimension bar comprising similar pattern.

Second Embodiment

Figure 8A:
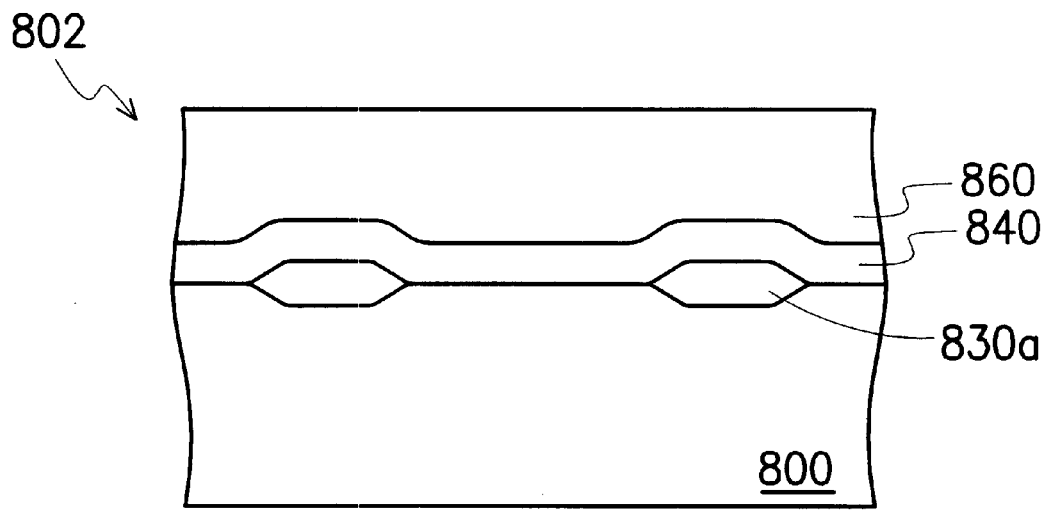
FIGS. 8A–8B show the formation of the field oxide layer and the polygate line on the die according to a second embodiment of the invention.
Figure 8B:
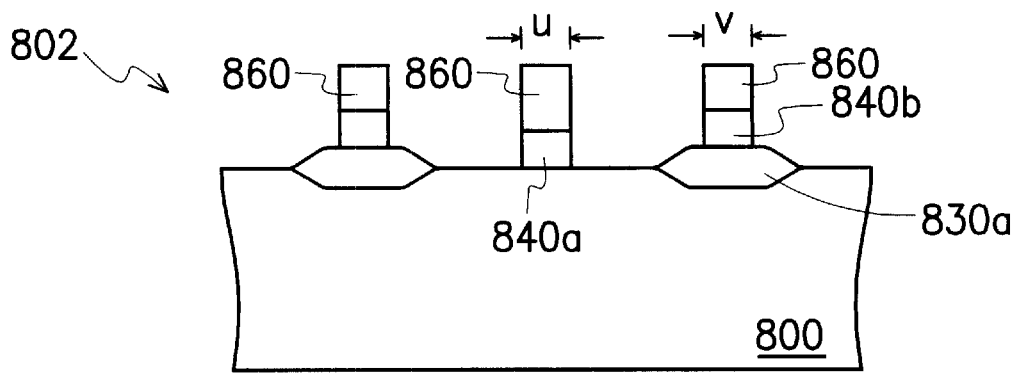

In the first embodiment, the structure and fabrication process of the critical dimension bar for monitoring the critical dimension of contact window are illustrated as shown in FIGS. 8A–8C. The structure and fabrication process of various layers on the die are illustrated in FIGS. 9A–9B.

Figure 9A:
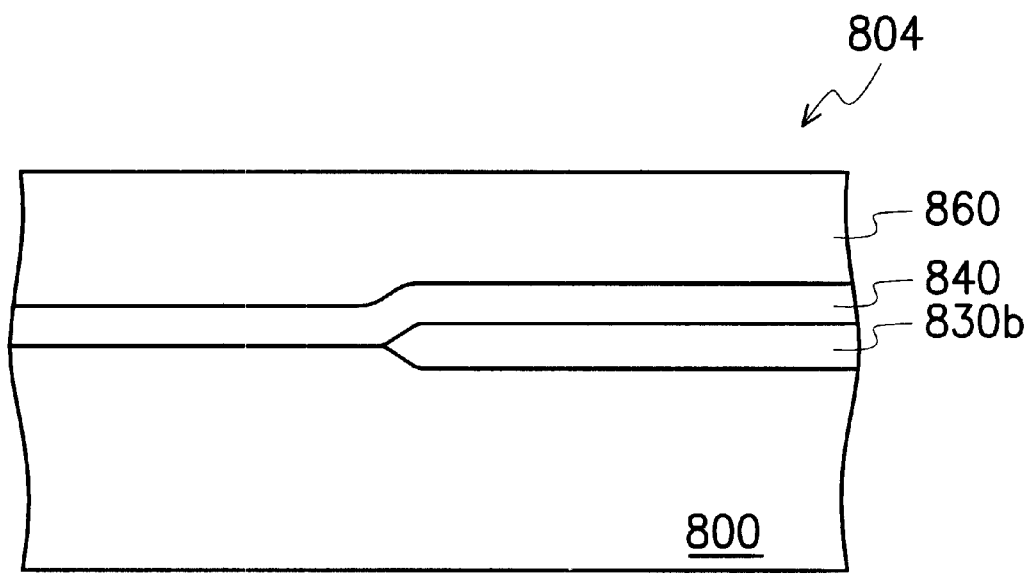
FIGS. 9A–9B show the fabrication process of a critical dimension bar in the second embodiment.

Referring to FIGS. 8A and 9A, using thermal oxidation, a field oxide layer 830a and 830b are formed on the die 802 and the critical dimension bar 804 simultaneously. Since the field oxide layers 830a and 830b are formed simultaneous with similar conditions, these two layers are of about the same thickness. A conformal polysilicon layer 840 is formed on both the die 802 and the critical dimension 804. On the polysilicon layer 840, a photoresist layer 860 is formed.

Figure 9B:
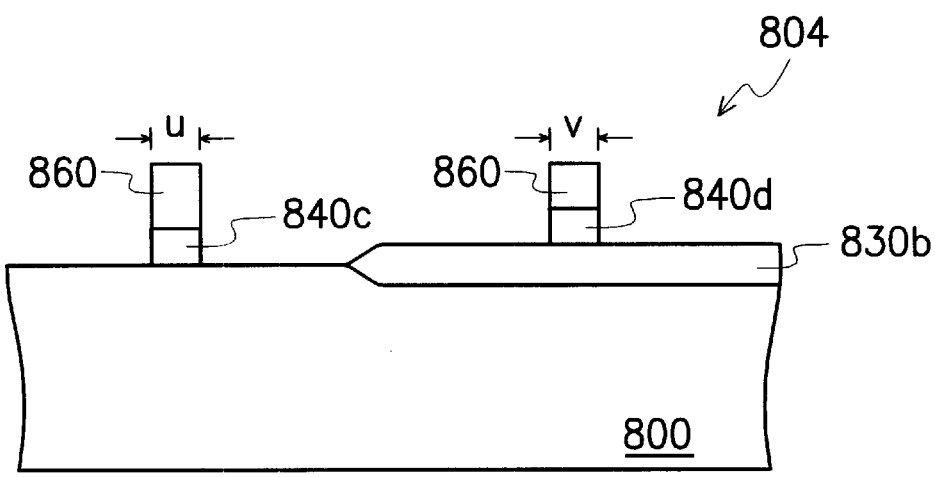

In FIGS. 8B and 9B, the photoresist layer is patterned by performing a photolithography and etching process. The photomask used in the process includes a die photomask pattern, a first test photomask pattern and a second test photomask pattern that correspond to the die 802, the elevated area (the surface of the thermal oxide layer 830b) and the lower area (the surface of the substrate 800) of the critical dimension bar 804). These three patterns are a linear type patterns with equal width.

The photoresist layer 860 is used as a mask to etch the polysilicon layer 840, so that the polygate lines 840a and 840b are formed on the substrate surface 400 and the over the field oxide layer 830a in the die 802, respectively. Meanwhile, the polysilicon layers 840c and 840d are formed on the substrate surface 800 and over the field oxide layer 830b in the critical dimension bar 804.

Referring to FIGS. 8A and 9A, the thickness of the field oxide layers 830a and 930b is similar, and the thickness of the polysilicon layer 840 is also the same in both areas.

Therefore, the elevated area of the die 802 is at the same height as the elevated area of the critical dimension bar 804. Similarly, the lower areas of both the die 802 and the critical dimension bar 804 are also at the same height. The linear polysilicon layer 840c thus has a critical dimension the same as that of the linear polygate 840a u. The linear polysilicon layer 840d also has a critical dimension v the same as that of the polygate 840b.

Figure 6:
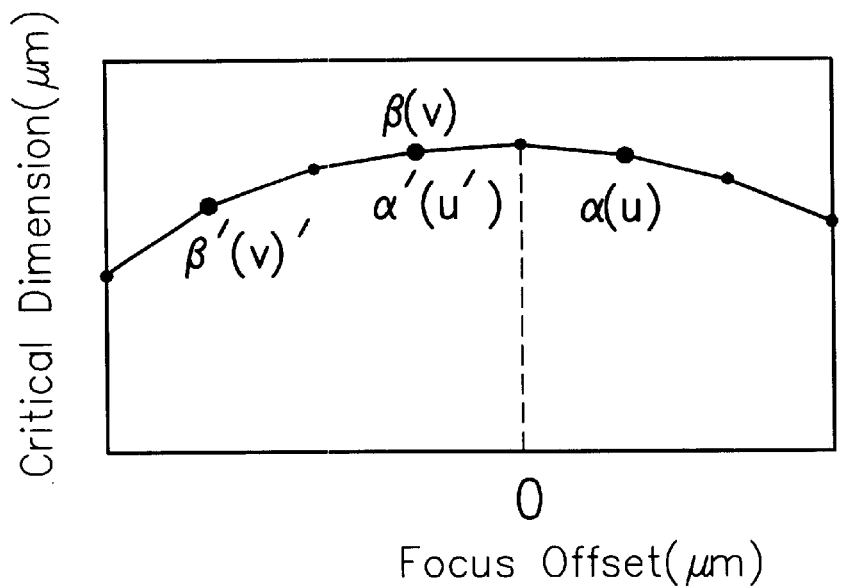
FIG. 6 shows the relationship between the critical dimension and the focus offset.

In FIGS. 8B and 9B, as the critical dimensions of the polysilicon layer 840c, 840d are the same as those of the polygate lines 840a, 840b, respectively, the critical dimensions of the polygates 840a and 840b can be inferred by measuring the u and v. As shown in FIG. 6, when the values of u and v are close to each other, the focal point of the exposure light is located between the top surface of the polysilicon layer 840 in the lower area and that in the elevated area. That is, it is located between the top surface of the polysilicon layer 840 over the lower area (the substrate surface 800) and that over the elevated area (the field oxide layer 830b). In contrast, when the values of u and v are far different from each other, the exposure light source if focused under the top surface of the polysilicon layer 840 in the die 802 (the critical dimension bar 804). That is, the exposure light source is focused at positions where the focus deviation is smaller than zero, such as the positions where the u' and v' lcoat in FIG. 6. Alternatively, the exposure light source is focused over the top surface of the polysilicon layer 840 in the elevated area where the focus deviation is larger than 0. Under both circumstances, the position of the wafer has to be adjusted to change the focus position of the exposure light source to minimize the difference in critical dimension for the polygate lines 840a and the 840b in the lower and elevated areas.

Figure 10:
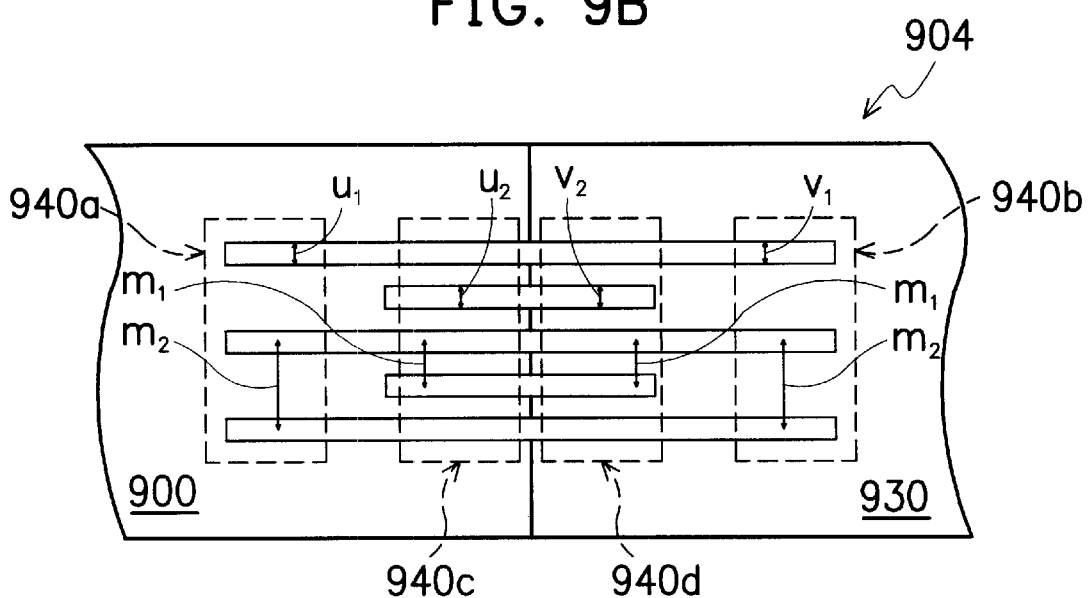
FIG. 10 show the structure of the critical dimension bar comprising the polygate line pattern with dense and dispersive distribution in the second embodiment.

In FIG. 10, in addition to the critical dimension bar for the isolated polygate lines, another structure of critical dimension bar 904 is further illustrated. The formation process of such structure is similar to that as shown in FIGS. 9A–9B. However, the openings formed in both the elevated area and the lower area are further distinguished into high density and low density areas. While patterning the polysilicon layer, the photomask comprises the die photomask pattern, the first test photomask pattern and the second test photomask pattern corresponding to the die 902, the elevated area (the thermal oxide layer 930) and the lower area (the substrate surface 900) in critical dimension bar 904. These three photomask patterns all include linear type patterns with equal width and can be distinguished into dense and diffusive area.

Further referring to FIG. 10, the pattern of the critical dimension bar 904 can be separated into four areas, and the lower area (the substrate surface area 900) further includes:

1. The dispersively distributed polysilicon layers 940a have a width $u_1$ and a pitch $m_2$, and the duty ratio of these openings is $u_1:m_2$, for example, 1:4.0 to simulate the isolated polygate lines in the lower area of the die; and
2. The densely distributed polysilicon layers 940c have a width $u_2$ and a pitch $m_2$, and the duty ratio of these polysilicon layers is $u_2:m_1$, for example, 1:2.0 to simulate the closely distributed polysilicon layers in the lower area of the die.

The elevated area (the thermal oxide layer 930) comprises:

3. The densely distributed polysilicon layers 940d have a width $v_2$ and a pitch $m_1$, and the duty ratio of these openings is $v_2:m_1$, for example, 1:2.0 to simulate the closely distributed openings in the elevated area of the die; and
4. The dispersively distributed openings 940b have a width $v_1$ and a pitch $m_2$, and the duty ratio of these polysilicon gate layers is $v_1:m_2$, for example, 1:4.0 to simulate the isolated polygate lines in the lower area of the die.

Thus, the critical dimensions of the densely and dispersively polygate lines in the elevated and lower areas in the die can be inferred from the critical dimensions $u_1$, $u_2$, $v_1$, $v_2$. Therefore, whether the focal point of the exposure light should be adjusted can be determined according to the critical dimensions.

As described above, due to the formation of the thermal oxide layer 804(904) formed on a portion of the substrate 800(900) and the conformal polysilicon layer 840(904), the critical dimension bar 804(904) thus has an uneven surface. The difference in surface levels the same as that in the die. The critical dimensions of the polygate lines 840a and 840b formed in the die can thus be inferred according to the measurement of the width $u(u_1, u_2)$ and $v(v_1, v_2)$. When the polygate lines formed in the die are distributed non-uniformly, the critical dimensions thereof can also be simulated via the critical dimension bar comprising similar pattern in the critical dimension bar.

The advantages of the above two embodiments comprise at least the followings. The design of the critical dimension bar includes a base layer (the thermal oxide layer and the polysilicon layer, or the thermal oxide layer only) to simulate the difference in surface level of the die. As a result, the opening or the linear pattern formed on an uneven surface of the die can be precisely simulated from the similar structure of the critical dimension bar. When the pattern comprises densely and dispersively distributed openings or polygate lines, the testing pattern on the critical dimension bar also comprises such densely and dispersively distributed openings or polygate lines. Therefore, the critical dimension of the die can be precisely reflected from the critical dimension bar.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A structure of a critical dimension bar formed on a test region between a plurality of dies of a substrate, each of the dies being divided into a plurality of higher areas and a plurality of lower areas with respect to the higher areas, wherein, a height difference is formed between the higher and the lower areas, and a top surface of the substrate within the lower areas is the same level as a top surface of the substrate within the test region, the structure comprising;

a base layer on a portion of the substrate within the test region, the base layer having a thickness same as the height difference, and a region outside the base layer within the test region being defined as a lower region; and a patterned critical material layer, covering the dies and the test region with equal uniform thickness; wherein the critical material layer on each of the die comprises a die pattern;
the critical material layer on the base layer within the test region comprises a first test pattern; and
the critical material layer on the lower region comprises a second test pattern, and the die pattern, the first and second test pattern are obtained from a die photomask pattern, a first test photomask pattern and a second test photomask pattern with equal pattern width.

2. The structure according to claim 1, wherein the critical material layer comprises an insulation layer, and the die pattern comprises a contact window pattern or a via hole pattern.

3. The structure according to claim 1, wherein the critical material layer comprises a conductive layer, and the die pattern comprises a gate electride line pattern or a conductive line pattern.

4. The structure according to claim 1, wherein each of the die pattern, the first and the second test patterns is further separated into a first region and a second region with a first duty ratio and a second duty ratio, respectively.

5. The structure according to claim 4, wherein the critical material layer comprises an insulation layer, and the die pattern comprises a contact window pattern or a via hole pattern.

6. The structure according to claim 2, wherein the critical material layer comprises a conductive layer and the die pattern comprises a gate line or a conductive line.

7. A structure of critical dimension bar formed on a test region between a plurality of dies of a substrate, wherein a plurality of field oxide layers and a plurality of polygate lines are formed on the substrate within the dies, and a portion of the polygate line are formed on the field oxide layers, the structure comprising:

a thermal oxide layer formed on a portion of the substrate within the test region, the thermal oxide layer having a thickness the same as the field oxide layer, and a region outside the thermal oxide within the test region being defined as lower region;

a polysilicon layer formed on the substrate, a part of the polysilicon layer being formed on the thermal oxide layer with a thickness the same as the polygate line; and a portion of a patterned insulation layer, the insulation layer covering the die, the test region and the polysilicon layer with a uniform thickness; wherein the insulation layer on each of the dies, the polysilicon layer within the test region and the lower region respectively comprises a contact window type die pattern, a contact window type first test pattern and a contact window type second pattern, respectively transferred from a die photomask pattern, a first test photomask pattern and a second photomask pattern with equal pattern width.

8. The structure according to claim 7, wherein each of the die pattern, the first test pattern and the second test pattern can be further separated into a first region and a second region with a first duty ratio and a second duty ratio, respectively.

9. The structure according to claim 8, wherein the first duty ratio includes 1:3 and the second duty ratio includes 1:1.5.

10. A structure of a critical dimension bar, formed on a test region a plurality of dies of a sustrate, wherein the substrate within each of the dies comprises a plurality of field oxide layers formed thereon and a plurality of polygate lines, a portion of the polygate lines across over the field oxide layers, the structure comprising:

a thermal oxide layer, formed on a portion of the substrate within the test region with a thickness the same as the field oxide layer, and a region outside the thermal oxide within the test region being defined as lower region;

a first patterned polysilicon layer, formed on the thermal oxide layer and comprising a first test pattern with a thickness the same as the polygate line; and a second patterned polysilicon layer, formed on the substrate within the lower region and comprising a second test pattern with a thickness the same as the polygate line; wherein the polygate lines, the first test pattern and the second test pattern are transferred from a die photomask pattern, a first test photomask pattern and a second test photomask pattern with an equal pattern width.

11. The structure according to claim 10, wherein each of the die pattern, the first test pattern and the second test pattern can be further separated into a first region and a second region with a first duty ratio and a second duty ratio, respectively.

12. The structure according to claim 11, wherein the first duty ratio includes 1:4 and the second duty ratio includes 1:2.

* * * * *